(12) United States Patent
Black et al.

(10) Patent No.: US 8,247,292 B2
(45) Date of Patent: Aug. 21, 2012

(54) NONVOLATIVE MEMORY DEVICE USING SEMICONDUCTOR NANOCRYSTALS AND METHOD OF FORMING SAME

(75) Inventors: Charles T. Black, New York, NY (US); Kathryn Wilder Guarini, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/095,577

(22) Filed: Apr. 27, 2011

(65) Prior Publication Data

US 2011/0201182 A1 Aug. 18, 2011

Related U.S. Application Data

(62) Division of application No. 11/373,127, filed on Mar. 13, 2006, now Pat. No. 7,985,686, which is a division of application No. 10/465,797, filed on Jun. 20, 2003, now Pat. No. 7,045,851.

(51) Int. Cl.
*H01L 21/8247* (2006.01)

(52) U.S. Cl. ........ 438/257; 438/260; 438/481; 438/593; 438/947; 257/E21.09; 257/E21.209; 257/E21.422; 257/E21.681; 977/773; 977/790; 977/883

(58) Field of Classification Search ............ 438/257, 438/260, 481, 593, 947; 977/790, 856, 857, 977/883, 892, 893, 773; 257/E21.09, E21.209, 257/E21.422, E21.681
See application file for complete search history.

(56) References Cited

U.S. PATENT DOCUMENTS

| | | | |
|---|---|---|---|
| 4,045,302 | A | 8/1977 | Gibbs et al. |
| 5,405,799 | A | 4/1995 | Woo et al. |
| 5,583,069 | A | 12/1996 | Ahn et al. |
| 5,656,205 | A | 8/1997 | Rabolt et al. |
| 5,714,766 | A | 2/1998 | Chen et al. |
| 5,849,215 | A | 12/1998 | Gin et al. |
| 5,880,012 | A | 3/1999 | Ha et al. |
| 5,948,470 | A | 9/1999 | Harrison et al. |
| 6,069,380 | A | 5/2000 | Chou et al. |
| 6,090,666 | A | 7/2000 | Ueda et al. |

(Continued)

FOREIGN PATENT DOCUMENTS

EP 1 256 986 11/2002
(Continued)

OTHER PUBLICATIONS

Guarini K.W., et al. "Process Integration of self-assembled polymer templates into silicon nanofabrication", *Journal of Vacuum Science and Technology*. B, Microelectronics and Nanometer Structures Processing, Measurement and Phenomena, American Institute of Physics, New York, NY, US, vol. 20, No. 6, Nov. 2002, pp. 2788-2792, XP012009632 ISSN: 1071-1023.

(Continued)

*Primary Examiner* — Mary Wilczewski
*Assistant Examiner* — Toniae Thomas
(74) *Attorney, Agent, or Firm* — McGinn IP Law Group, PLLC

(57) ABSTRACT

A method of making a uniform nanoparticle array, including performing diblock copolymer thin film self assembly over a first dielectric on silicon, creating a porous polymer film, transferring a pattern into the first dielectric, selectively growing epitaxial silicon off a silicon substrate from within pores to create a silicon nanoparticle array.

5 Claims, 7 Drawing Sheets

U.S. PATENT DOCUMENTS

| | | | |
|---|---|---|---|
| 6,139,713 | A | 10/2000 | Masuda et al. |
| 6,171,687 | B1 | 1/2001 | Leung et al. |
| 6,214,746 | B1 | 4/2001 | Leung et al. |
| 6,271,273 | B1 | 8/2001 | You et al. |
| 6,310,376 | B1 | 10/2001 | Ueda et al. |
| 6,313,185 | B1 | 11/2001 | Lau et al. |
| 6,320,784 | B1 | 11/2001 | Muralidhar et al. |
| 6,331,463 | B1 | 12/2001 | Chen |
| 6,358,813 | B1 | 3/2002 | Holmes et al. |
| 6,407,424 | B2 | 6/2002 | Forbes |
| 6,536,604 | B1 | 3/2003 | Brinker et al. |
| 6,586,785 | B2 | 7/2003 | Flagan et al. |
| 6,589,629 | B1 | 7/2003 | Bao et al. |
| 6,638,441 | B2 | 10/2003 | Chang et al. |
| 6,705,152 | B2 | 3/2004 | Routkevitch et al. |
| 6,717,860 | B1 | 4/2004 | Fujiwara |
| 6,743,406 | B2 | 6/2004 | Nayfeh et al. |
| 6,841,082 | B2 * | 1/2005 | Ha et al. .................. 216/44 |
| 6,949,793 | B2 | 9/2005 | Choi et al. |
| 7,572,669 | B2 | 8/2009 | Tuominen et al. |
| 7,850,941 | B2 | 12/2010 | Tsakalakos et al. |
| 2004/0256662 | A1 | 12/2004 | Black et al. |
| 2008/0157314 | A1 * | 7/2008 | Clevenger et al. ............ 257/679 |

FOREIGN PATENT DOCUMENTS

| | | |
|---|---|---|
| JP | 2001-233674 | 8/2001 |

OTHER PUBLICATIONS

Guarini, K.W., et al. "Optimization of Diblock Copolymer Thin Film Self Assembly", *Advanced Materials*, vol. 14, No. 18, Sep. 16, 2002, pp. 1290-1294, XP002303851 Wiley-VCH, Weinheim, DE, ISSN: 0935-9648.

Park Miri, et al. "Large area dense nanoscale patterning of arbitrary surfaces", *Applied Physics Letters, American Institute of Physics*, New York, US, vol. 79, No. 2, Jul. 9, 2001, pp. 257-259, XP012029389 ISSN: 0003-6951.

Guarini, K.W., et al. "Nanoscale patterning using self-assembled polymers for semiconductor applications", *Journal of Vacuum Science and Technology*, B, Microelectronics and Nanometer Structures Processing, Measurement and Phenomena, American Institute of Physics, New York, NY, US, vol. 19, No. 6, Nov. 2001, pp. 2784-2788, XP012009128 ISSN: 1071-1023.

Li, R.R., et al. "Dense arrays of ordered GaAs nanostructures by selective area growth on substrates patterned by block copolymer lithography", *Applied Physics Letters, American Institute of Physics*, New York, US, vol. 76, No. 13, Mar. 27, 2000, pp. 1689-1691, XP012024907 ISSN: 0003-6951.

Harrison Christopher, et al. "Lithography with a mask of block copolymer microstructures", *Journal of Vacuum Science & Technology* B: Microelectronics Processing and Phenomena, American Vacuum Society, New York, NY, US, vol. 16, No. 2, Mar. 1998, pp. 544-552, XP012006671 ISSN: 0734-211X.

Park, M., et al. "Block Copolymer Lithography: Periodic Arrays of about 10 to the 11th Holes in 1 Square Centimeter", Science, *American Association for the Advancement of Science*, US, vol. 276, May 30, 1997, pp. 1401-1404, XP002223276 ISSN: 0036-8075.

Ostraat, M.L., et al. "Synthesis and characterization of aerosol silicon nanocrystal nonvolatile floating-gate memory sdevices", *Applied Physics Letters, American Institute of Physics*, New York, US, vol. 79, No. 3, Jul. 16, 2001, pp. 433-435, XP012029871 ISSN: 0003-6951.

International Search Report dated Nov. 16, 2004.

Tejal Desai, et al., "Nanoporous Anti-Fouling Silicon Membranes for Biosensor Applications," Biosensors & Bioelectronics, vol. 15, 2000, pp. 453-462.

Sandip Tiwari et al., "Volatile and Non-Volatile Memories in Silicon with Nano-Crystal Storage", IEEE, 1995, pp. 20.4.1-20.4.4.

Ya-Chin King et al., "MOS Memory Using Germanium Nanocrystals Formed by Thermal Oxidation of $Si_{1-x}Ge_x$", IEEE, 1998, pp. 5.3.1-5.3.4.

M.L. Ostraat et al., "Synthesis and characterization of aerosol silicon nanocrystal nonvolatile floating-gate memory devices", Applied Physics Letters, vol. 79, No. 3, Jul. 16, 2001, pp. 433-435.

S. Tiwari et al., "Small silicon memories: confinement, single-electron, and interface state considerations", Appl. Phys. A 71, 403-414 (2000)/Digital Object Identifier (DOI), Sep. 6, 2000.

Sandip Tiwari et al., "A silicon nanocrystals based memory", Appl. Phys. Lett. 68 (10), Mar. 4, 1996, pp. 1377-1379.

J. J. Welser et al., "Room Temperature Operation of a Quantum-Dot Flash Memory", IEEE Electron Device Letters, vol. 18, No. 6, Jun. 1997, pp. 278-280.

Hussein I. Hanafi et al., "Fast and Long Retention-Time Nano-Crystal Memory", IEEE Translations on Electron Devices, vol. 43, No. 9, Sep. 1996, pp. 1553-1558.

Paolo Pavan et al., "Flash Memory Cells-An Overview", Proceedings of the IEEE, vol. 85, No. 8, Aug. 1997, pp. 1248-1271.

Ilgweon Kim et al., "Room Temperature Single Electron Effects in a Si Nano-Crystal Memory", IEEE Electron Device Letters, vol. 20, No. 12, Dec. 1999, pp. 630-631.

Min She et al., "Modeling and Design Study of Nanocrystal Memory Devices", Dept. of Electrical Engineering and Computer Sciences, University of California Berkeley, CA, pp. 139-140.

Office Action dated Nov. 26, 2010, in U.S. Appl. No. 12/545,010.

* cited by examiner

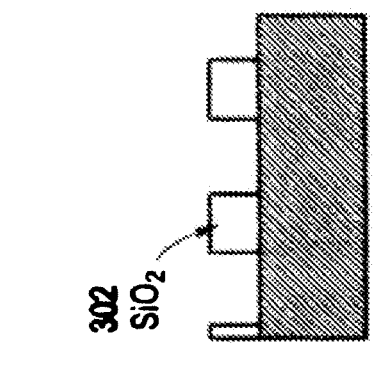
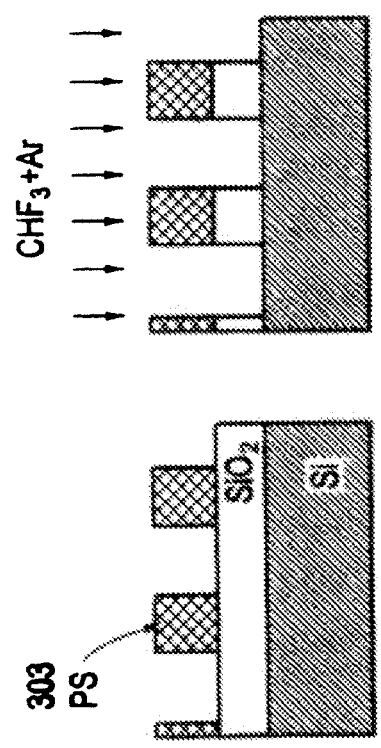
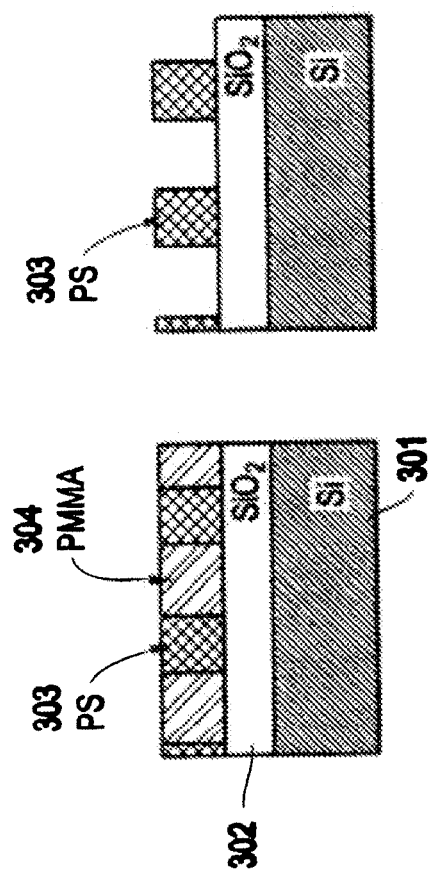
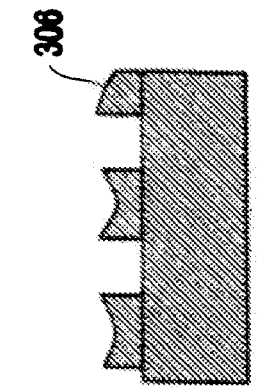
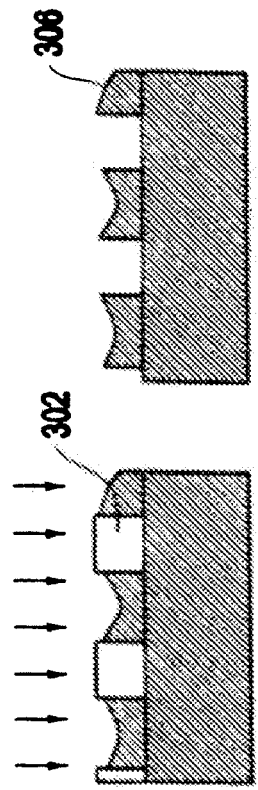
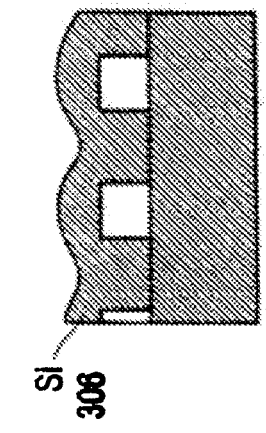

NONVOLATIVE MEMORY DEVICE USING SEMICONDUCTOR NANOCRYSTALS AND METHOD OF FORMING SAME

CROSS-REFERENCE TO RELATED APPLICATIONS

The present application is a divisional application of application Ser. No. 11/373,127 filed on Mar. 13, 2006, now U.S. Pat. No. 7,985,686, which is a divisional application of application Ser. No. 10/465,797 filed on Jun. 20, 2003, now U.S. Pat. No. 7,045,851.

BACKGROUND OF THE INVENTION

1. Field of the Invention

The present invention generally relates to a memory device, and more particularly to a nonvolatile memory device using semiconductor crystals and a method for making the same.

2. Description of the Related Art

Nonvolatile memory is ubiquitous in today's technology-laden world, and the most prevalent type of device used to store information is the flash memory.

In addition to the need for integrated nonvolatile memory in logic systems, there is a large (and rapidly increasing) market for flash memories as stand-alone storage elements. Cellular telephones and digital cameras are several examples of devices which benefit from nonvolatile flash memory cards.

There are various forecasts predicting increased future markets for this type of storage (e.g., see P. Pavan, R. Bez, P. Olivio, and E. Zanoni, *IEEE Proc.* 85 1248 (1997).

Flash memory is based on the concept of a field effect transistor (FET) whose threshold voltage (VT) can be reversibly changed between first and second values.

As shown in the side sectional view of FIG. 1(a), a conventional flash memory device 100 is shown including a substrate 101, source 102 and drain 103, formed in the substrate 101 with a channel 104 formed therebetween, a program oxide 105 formed over the substrate 101, a floating gate 106 formed over the program oxide 105, a control oxide 107 formed over the floating gate 106, and a control gate 108 formed over the control oxide 107.

A main component of the flash memory device 100 which facilitates this multi-state operation is a conducting floating gate 106 in the gate stack of the transistor (see FIG. 1(a)) which is coupled to its surroundings (the control gate 108, and also the channel 104/source 102/drain 103 regions) via dielectrics (e.g., 107, 105) on top and below.

The device 100 is programmed by injecting charge into the floating gate 106 (though the program oxide 105), and is erased by expelling charge from the floating gate 106. These devices 100 are made nonvolatile by 3 decoupling the floating gate 106 from the source 102/drain 103/channel 104 and control gate 108 with a sufficiently thick control oxide 107.

As with all other semiconductor technologies, flash memory continues to scale to increasingly higher densities. At the same time, improvements in device speed, power consumption, and endurance (e.g., number of times the memory can be read/erased before failing) also pay obvious benefits.

Finally, some flash memory devices have improved performance through storage of multiple bits per memory cell (e.g., most notably Intel's StrataFlash™ technology currently stores 2 bits/cell with announced future plans to increase the number of bits/cell). This is achieved by programming the floating gate 106 with different amounts of charge in order to achieve multiple possible threshold voltage (VT) shifts in the same device.

The pathway to many of these density and performance benefits involves scaling the memory FET, which is becoming increasingly difficult. For example, shrinking the device width in order to improve packing density and speed results in increased drain turn-on effects from capacitive coupling between the drain 103 and the floating gate 106.

Also, thinning the program oxide 105 thickness in order to achieve lower write/erase voltages (and thus lower power) has the effect of reducing retention times and reliability.

Referring to FIG. 1(b), nanocrystal memory devices have been proposed as a way to improve the scaling of flash memory devices, and also as a possible means to achieve robust multi-bit operation (e.g., see H. Hanafi, *IEEE Trans. Elect. Dev.* 43 1553 (1996); S. Tiwari, F. Rana, H. Hanafi, A. 4 Hartstein, E. Crabbe, C. Chan, *Appl. Phys. Lett.* 68 1377 (1996); and S. Tiwari, F. Rana, K. Chan, H. Hanafi, W. Chan, D. Buchanan, *IEDM* 521 (1995)).

Turning to the conventional nanocrystal memory device 150 shown in FIG. 1(b), the structure is somewhat similar to that shown in FIG. 1(a) except that the floating gate 106 is replaced with nanocrystals 156.

That is, a basic idea in nanocrystal memory devices is that breaking up a continuous, conducting floating gate 106 into small bits of isolated conducting material can aid in overcoming some of the roadblocks to further scaling.

The nanocrystal floating gate 156 has reduced capacitive coupling to the source 151/drain region 152, which leads to a smaller drain turn-on effect. In addition, the nanocrystal floating gate 106 should make the device less susceptible to stress-induced leakage current. That is, if an individual nanocrystal becomes shorted to the channel 154, other nanocrystals remain unaffected. In a standard floating gate device (e.g., such as device 100), any short to the channel 104 is disastrous because charge can no longer be maintained in the floating gate 106.

Nanocrystal floating gate devices (e.g., such as those exemplified by reference numeral 150 in FIG. 1(b)) have improved retention characteristics compared to conventional flash devices with the same program oxide thicknesses, because most charge leakage from the floating gate 156 occurs to the heavily doped source 152/drain regions 153.

In a flash device, such leakage will deplete charge from the entire floating gate, resulting in a loss of memory (e.g., in the same way as stress-induced leakage currents compromise the device).

In a nanocrystal device, only those nanocrystals in close proximity to the source 152/drain 153 lose their charge by this leakage mechanism, while those farther away (e.g., near the device center) do not. This argument assumes that there is no electrical conduction between nanocrystals in the floating gate 156 (e.g., a condition which can be controlled via the nanocrystal density).

The improved retention properties of nanocrystal floating gate devices 150 allows scaling to thinner program oxides 155, which can result in added benefits. Thinner oxides 155 permit programming at lower voltages using direct quantum mechanical tunneling, rather than Fowler-Nordheim field emission processes.

In addition to the obvious lower-power benefit of lower voltage operation, there is some evidence which suggests that a direct tunneling write/erase mechanism puts less stress on the program oxide 155, thereby resulting in increased device cyclability. Modeling also suggests that devices with thinner oxides 155 can be programmed more quickly (e.g., see M. She, Y. C. King, T. J. King, C. Hu, *IEEE Device Research Conference*, 139 (2001)).

One of the more intriguing aspects of nanocrystal memories 150 is the possibility to program the floating gate 156 with discrete numbers of electrons, which in turn leads to multiple discrete, well-defined device 6 threshold voltage (VT) shifts. The idea is that the electrostatic energy necessary to add a single charge to a sufficiently small nanocrystal can become significant. This electrostatic charging energy is given by:

$$U = \frac{e^2}{2C_\Sigma} \quad (1)$$

where e is the electron charge and $C_\Sigma$ is the nanocrystal capacitance to its surroundings. Tiwari et al. have estimated this charging energy for different diameter nanocrystals (in this calculation, the nanocrystals were assumed to be spherical) (e.g., see S. Tiwari, J. A. Wahl, H. Silva, F. Rana, J. J. Welser, *Appl. Phys. A* 71 403 (2000)). The results are shown in Table 1. The charge stored in the floating gate will shift the device VT by an amount:

$$\Delta V_T \approx \frac{-Q}{C_{ctl}} \quad (2)$$

where Q is the amount of charge stored on the floating gate 156 and Cctl is the floating gate capacitance to the control gate 158. Tiwari et al. have also computed the ΔVT for charge stored in different sized nanocrystals. These results are also shown in Table 1 below.

TABLE 1

| Nanocrystal Diameter (nm) | Ec (eV) | ΔVT (for a single added charge) (V) |
|---|---|---|
| 30 | .011 | .03 |
| 20 | .018 | .06 |
| 10 | .036 | .23 |
| 5 | .072 | .8 |
| 2 | .178 | >5 |

Table 1 above illustrates a calculated charging energy (Ec) and corresponding threshold voltage shift (ΔVT) for nanocrystals of different sizes (e.g., from Tiwari et al., mentioned above).

Table 1 shows that the addition of a single charge to a nanocrystal can result in a significant threshold voltage shift (ΔVT~0.5 V for a nanocrystal diameter between 5-10 nm). In this way, it may be possible to use this effect for multi-bit storage, where discrete VT shifts correspond to adding incrementally larger numbers of charges to the floating gate 156. These types of discrete VT shifts from adding single charges have been seen experimentally in extremely small devices in which the floating gate 156 contains only a single nanocrystal (e.g., see J. J. Welser, S. Tiwari, S. Rishton, K. Y. Lee, Y. Lee, *IEEE Elect. Dev. Lett.* 18 278 (1997).

In more conventional devices where the floating gate 156 contains many nanocrystals (e.g., instead of a single one), effects due to discrete charging are usually averaged out due to nanocrystal size distributions.

In order to observe this effect (and thus make possible multi-bit storage in the device), it is essential to define all nanocrystals to be of similar size.

Several groups have demonstrated implementations of nanocrystal-based flash memories. However, none has defined all nanocrystals to be of similar size by using a self-assembly technique. Tiwari et al. have published numerous papers and also hold a patent (e.g., see U.S. Pat. No. 5,714, 766, incorporated herein by reference) on a memory device based on CVD-deposited silicon nanocrystals.

Kim et al. have also published results on a similar device (e.g., see I. Kim et al., *IEEE Electron Dev. Lett.* 20 630 (1999)). Welser et al. (e.g., see above-mentioned J. J. Welser, S. Tiwari, S. Rishton, K. Y. Lee, Y. Lee, *IEEE Elect. Dev. Lett.* 18 278 (1997), have demonstrated a memory device based on a single nanocrystal in the floating gate. This type of device is often called a "quantum dot memory". Chou et al. also hold a patent on this device structure (e.g., see U.S. Pat. No. 6,069, 380, incorporated herein by reference).

Ostraat et al. have described operation of a memory device in which the floating gate contains aerosol-deposited silicon nanocrystals (e.g., see M. L. Ostraat et al., *Appl. Phys. Lett.* 79 433 (2001)).

Finally, King et al. have described a device containing germanium nanocrystals (e.g., see Y. C. King, T. J. King, C. Hu, *IEDM*, 155 (1998)).

However, in each of these conventional demonstrations, the nanocrystal sizes were not well-defined, thereby leading to limitations on device performance improvements.

Additionally, as mentioned above and prior to the present invention, nanocrystal floating gate memories have been difficult to use for multi-bit memory applications, because of the large nanocrystal size distributions.

Further, prior to the present invention, defining all nanocrystals to be of substantially similar size (and thus making possible multi-bit storage in the device), has not been achieved.

Moreover, there has been no technique which produces a nanocrystal memory device having nanocrystal size distributions which are substantially uniform, using a self-assembly technique.

In sum, the conventional techniques (and subsequently the resulting structure) to make a nanocrystal memory have been notoriously unreliable, and it has been difficult to obtain uniform size of the nanocrystals, and difficult to control the spacing of the distribution around the sample, each of which impact the performance of the device.

SUMMARY OF THE INVENTION

In view of the foregoing and other problems, drawbacks, and disadvantages of the conventional methods and structures, an exemplary feature of the present invention is to provide a method (and structure) for building a nanocrystal memory device.

Another exemplary feature of the present invention is to form a nanocrystal memory device in which a self-assembled material is used to template or define the nanocrystals, and allowing good control over the uniformity of the size of the nanocrystal particles, and over their distribution (e.g., where the nanocrystals are located and the spacing between them).

In a first exemplary aspect of the present invention, a floating gate for a field effect transistor, includes discrete nanoparticles whose dimensions and distribution are defined by a self-assembling material. For example, in one exemplary aspect, the nanoparticles may have diameters between about 2 and about 30 nanometers, with size distributions no greater than substantially 15% of a mean diameter of the nanoparticles.

In a second exemplary aspect of the present invention, a field effect transistor, includes a source region and a drain region formed in a semiconductor material, a channel region disposed between the source region and the drain region, an insulating layer of electrically insulating material disposed over the channel region, a floating gate layer of electrically conducting material disposed over the insulating layer, a layer of electrically insulating material disposed over the floating gate layer, and a gate electrode overlying the layer of insulating material. The floating gate layer includes discrete nanoparticles whose dimensions and distribution are defined by a self-assembling material.

For example, in one exemplary aspect, the nanoparticle density may be greater than $10^{10}/cm^2$. In addition, in one exemplary aspect, the nanoparticles may be arranged in a cubic lattice, or a close-packed, two-dimensional hexagonal lattice. Further, the hexagonal lattice may include an average inter-nanoparticle distance between about 1 and about 2 times an average nanoparticle diameter, and a standard deviation of inter-nanoparticle distance no greater than substantially 20% of the mean distance. More specifically, the nanoparticles in the floating gate may include first and second distinct sizes, each with diameter standard deviations being less than approximately 15% of a mean diameter of the nanoparticles.

Further, in this exemplary aspect of the present invention, self assembly may involve a block copolymer film. For example, the block copolymer may include a diblock copolymer including a molecular weight within a range of about 5,000 kg/mol to about 250,000 kg/mol.

In a third exemplary aspect of the present invention, a method of forming a floating gate for a field effect transistor, includes forming discrete nanoparticles whose dimensions and distribution are defined using a self-assembled material to template the nanoparticles.

In a fourth exemplary aspect of the present invention, a method for making a uniform nanoparticle array, includes replicating a dimension of a polymer template in a dielectric film, to form a porous dielectric film, conformally depositing a material over the porous dielectric film, and anisotropically and selectively etching the deposited material.

In a fifth exemplary aspect of the present invention, a method for making a uniform nanoparticle array, includes performing a diblock copolymer thin film self assembly over a material film, creating a polymer dot array from the diblock copolymer thin film, and using a polymer dot of the polymer dot array as an etch mask for a nanoparticle reactive ion etching (RIE) of the material film.

In a sixth exemplary aspect of the present invention, a method for making a uniform nanoparticle array, includes performing a diblock copolymer thin film self assembly over silicon, creating a porous polymer film, directionally depositing a first material over the porous polymer film, and dissolving the polymer to lift off at least one region of the first material deposited over the porous polymer.

In a seventh exemplary aspect of the present invention, a method for making a uniform nanoparticle array, includes performing a diblock copolymer thin film self assembly over a first dielectric over an oxidizable material film, creating a porous polymer film, transferring a pattern into the first dielectric, etching the pattern into the material, and thermally oxidizing the material until a narrowest material region between hexagonally-arranged pores close, thereby leaving an array of material nanoparticles.

In an eighth exemplary aspect of the present invention, a method for making a uniform nanoparticle array, includes performing diblock copolymer thin film self assembly over a first dielectric on silicon, creating a porous polymer film, transferring a pattern into the first dielectric, and selectively growing epitaxial silicon off a silicon substrate from within pores to create a silicon nanoparticle array.

Additionally, the invention provides a method of fabricating a nanocrystal memory device.

With the unique and unobvious combination of exemplary features of the invention, a nanocrystal memory device can be formed in which the nanocrystals can be defined using a self-assembly process.

Further, the nanocrystal memory device (and the method for forming it) allows good control over the uniformity of the size of the nanocrystal particles, and over their distribution (e.g., where the nanocrystals are located and the spacing between them).

Hence, the inventive method results in a device having a regular array of such nanocrystals throughout the active area of the device.

BRIEF DESCRIPTION OF THE DRAWINGS

The foregoing and other purposes, aspects and advantages will be better understood from the following detailed description of an exemplary embodiment of the invention with reference to the drawings, in which:

FIG. 1(*b*) illustrates a schematic diagram of a conventional nanocrystal memory device 150;

FIG. 2(*b*) illustrates a histogram of pore diameters showing a narrow distribution of ~10% centered around 20 nm for PS-PMMA molecular weight 67 kg/mol;

FIG. 3(*a*) illustrates a step 310 of assembling PS-PMMA diblock copolymer on a thermally-oxidized silicon substrate;

FIG. 3(*b*) illustrates a step 320 of removing the PMMA block, leaving a porous PS template;

FIG. 3(*c*) illustrates a step 330 of using reactive ion etching (RIE) to transfer the PS pattern into the oxide film;

FIG. 3(*d*) illustrates a step 340 of stripping the remaining polymer, leaving a porous oxide film;

FIG. 3(*e*) illustrates a step 350 of conformally depositing a material (e.g., silicon);

FIG. 3(*f*) illustrates a step 360 of anisotropically etching the silicon; and FIG. 3(*g*) illustrates a step of 370 stripping oxide to leave the silicon nanocrystal array on silicon; and FIG. 3(*h*) illustrates a flowchart of the method 300 shown in FIGS. 3(*a*)-3(*g*)

FIG. 4(*a*) illustrates a step of assembling PS-PMMA diblock copolymer on a thermally-oxidized silicon substrate;

FIG. 4(*b*) illustrates a step of removing the PMMA block, leaving a porous PS template;

FIG. 4(*c*) illustrates a step 430 using reactive ion etching (RIE) to transfer the PS pattern into the oxide film;

FIG. 4(*d*) illustrates a step of stripping the remaining polymer, leaving a porous oxide film;

FIG. 4 (g) illustrates a step of stripping oxide to leave silicon nanocrystal array on silicon;

FIG. 4 (h) illustrates a step of stripping oxide to leave silicon nanocrystal array on silicon;

FIG. 4 (i) illustrates a step of stripping oxide to leave silicon nanocrystal array on silicon.

DETAILED DESCRIPTION OF EXEMPLARY EMBODIMENTS OF THE INVENTION

Figure 1A:
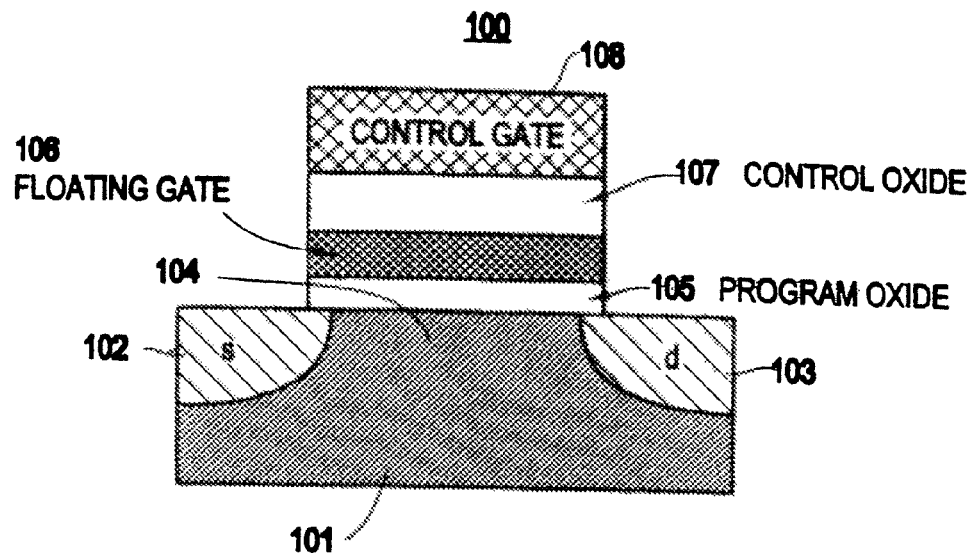
FIG. 1(*a*) illustrates a schematic diagram of a conventional flash memory device 100.
Figure 1B:
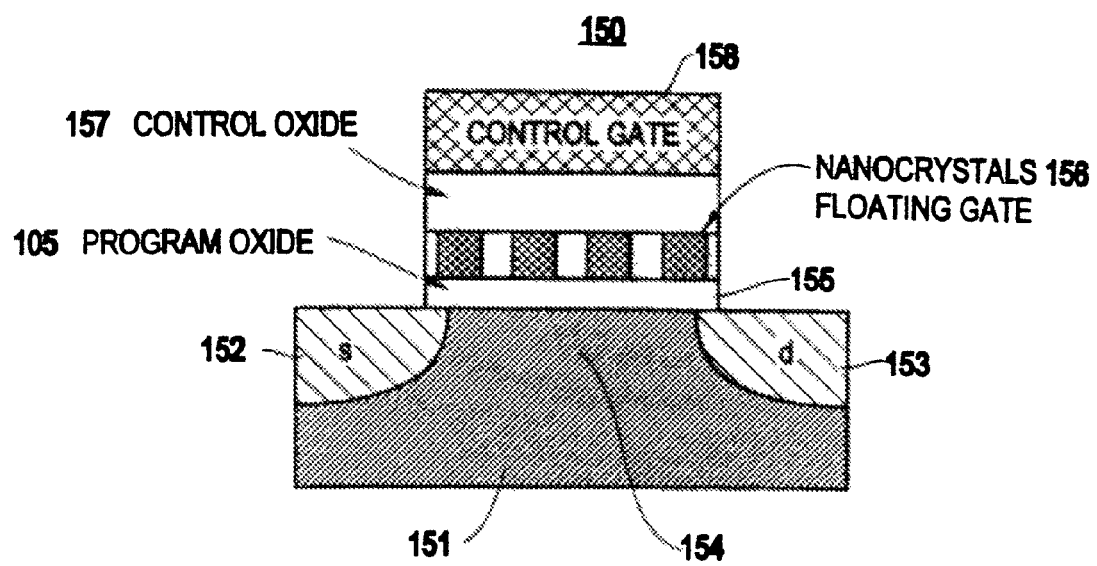

Referring now to the drawings, and more particularly to FIGS. 2-4(j), there are shown exemplary embodiments of the method and structures according to the present invention.

Exemplary Embodiment

First, hereinbelow is described an exemplary method for making dense silicon nanocrystal arrays based on self-assembly according to the present invention.

It is noted that, while a diblock copolymer is described exemplarily below, the invention is not limited to such materials as would be known by one of ordinary skill in the art, taking the present invention as a whole.

That is, the invention can generally take advantage of self-assembling materials which are not exclusively the particular diblock copolymers described below. There are a variety of different material which naturally form regular arrays, thereby allowing the invention to take advantage of the scale in self-assembling materials. Indeed, there are nanoparticles which self-assemble, there are proteins which naturally self-assemble, there are block copolymers which naturally self-assemble, there are self-assembled pores in anodized alumina, there are other self-assembling molecules including self-assembled monolayers (SAMs), etc., all of which the invention may be applied advantageously thereto.

The invention's use of self-assembly is clearly different from the conventional techniques. That is, the conventional techniques may include using a chemical vapor deposition (CVD) technique to scatter silicon over the sample. While this technique may be somewhat acceptable under some conditions, there is little control of the distribution, and there are small and large sizes randomly over the sample.

Another technique (e.g., on the other extreme from CVD) is using lithography in which patterning occurs, and more specifically a point is written at each location where a particle is to be placed. Such a technique is very tedious and slow, is not a very manufacturable solution, and does not achieve the resolution or reliability that can be achieved in a self-assembly process.

Thus, the invention's use of self-assembly overcomes the problems of the conventional techniques and allows controlling the size distribution and 17 positions (e.g., situs) of the particles, as well as a technique which is potentially more manufacturable, simpler, and scalable.

In order to achieve the above-mentioned performance improvements over the conventional flash memory and conventional nanocrystal memory devices, the present inventors have discovered that nanocrystals in the device floating gate according to the present invention must be discrete (i.e., electrically isolated from each other), and densely-spaced (e.g., in order to prevent electron conduction by percolation through the silicon channel).

For multi-bit memory operation, nanocrystal sizes should be highly uniform. Nanocrystal sizes on the order of about 3 nm to about 10 nm diameters should provide sufficient Coulomb charging energies for single-electron charging behavior at room temperature (e.g., see above-mentioned Tiwari et al. article).

Because the transistor device dimensions are typically defined at the limit of lithographic resolution, the nanocrystals residing in the gate stack must be much smaller than this and therefore must be defined using some non-lithographic means.

As mentioned above, previous demonstrations have used CVD-deposited or aerosol-deposited nanocrystals, which have inherent size variations.

In the present invention, the nanocrystals are preferably patterned using a self-assembly process, which sets (e.g., templates or defines) the dimensions, density, and uniformity of the nanocrystals. The characteristic dimensions of self-assembled films depend on fundamental length scales (e.g., 18 such as molecular size), and are therefore inherently more controllable than structures defined using deposition processes, whose size distributions are limited by nucleation and diffusion effects, and sample topography.

There are many self-assembling systems that result in regular arrays of nanometer-scale features.

In the present invention, a system is provided based exemplarily on diblock copolymer self-assembly in one embodiment. Obviously, the invention is not limited to the diblock copolymer material as mentioned above and would be clearly evident to one of ordinary skill in the art taking the present application as a whole. Indeed, other materials which could be used may include, as mentioned above, self-assembled nanoparticles, anodized alumina, self-assembling proteins, etc.

Under suitable process conditions (e.g., such as molecular weight, block weight ratio, film thickness, annealing conditions, surface treatment and the like), diblock copolymer molecules can microphase separate on a nanometer-scale length scale, thereby forming a hexagonal array of pores in a thin polymer film.

Many different polymers (e.g., such as
Polybutadiene-polybutylmethacrylate,
Polybutadiene-polydimethylsiloxane,
polybutadiene-polymethylmethacrylate,
polybutadiene-polyvinylpyridine,
polyisoprene-polymethylmethacrylate,
polyisoprene-polyvinylpyridine,
polybutylacrylate-polymethylmethacrylate,
polybutylacrylate-polyvinylpyridine,
polyhexylacrylate-polyvinylpyridine,
polyisobutylene-polybutylmethacrylate,
polyisobutylene-polydimethoxysiloxane,
polyisobutylene-polymethylmethacrylate,
polyisobutylene-polyvinylpyridine,
polybutylmethacrylate-polybutylacrylate,
polybutylmethacrylate-polyvinylpyridine,
polyethylene-polymethylmethacrylate,
polymethylmethacrylate-polybutylacrylate,
polymethylmethacrylate-polybutylmethacrylate,
polystyrene-polybutadiene,
polystyrene-polybutylacrylate,
polystyrene-polybutylmethacrylate,
polystyrene-polybutylstyrene,
polystyrene-polydimethoxysiloxane, polystyrene-polyisoprene,
polystyrene-polymethylmethacrylate,
polystyrene-polyvinylpyridine,
polyethylene-polyvinylpyridine,
polyvinylpyridine-polymethylmethacrylate,
polyethyleneoxide-polyisoprene,
polyethyleneoxide-polybutadiene,
polyethyleneoxide-polystyrene, and
polyethyleneoxide-polymethylmethacrylate
could be used for this process and other phase morphologies are achievable (e.g., besides the hexagonal close-packed cylindrical phase morphology described here). For example, other phase morphologies may include spherical phase, the lamellar phase, etc.

Figure 2A:
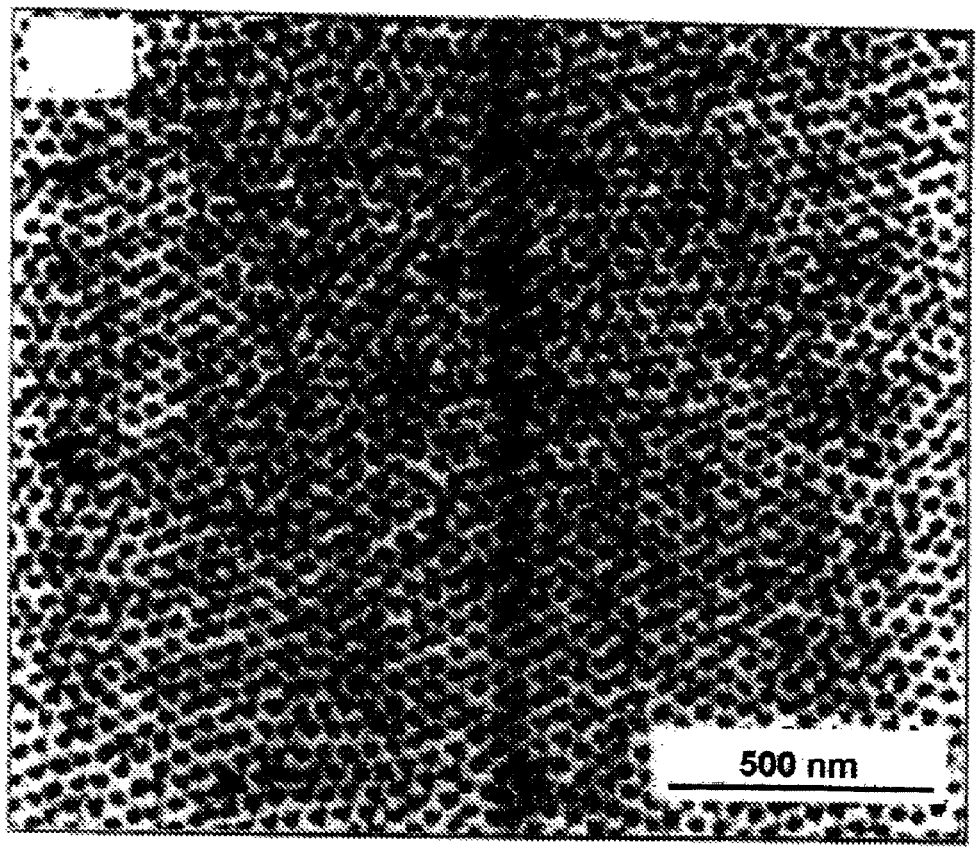
FIG. 2(*a*) illustrates a top-down scanning electron micrograph (SEM) image of a porous polystyrene (PS) thin film on silicon formed by diblock copolymer self assembly, and in which hexagonally-arranged dark circles are cylindrical holes in the PS film down to the substrate from which the PMMA has been selectively removed.
Figure 2B:
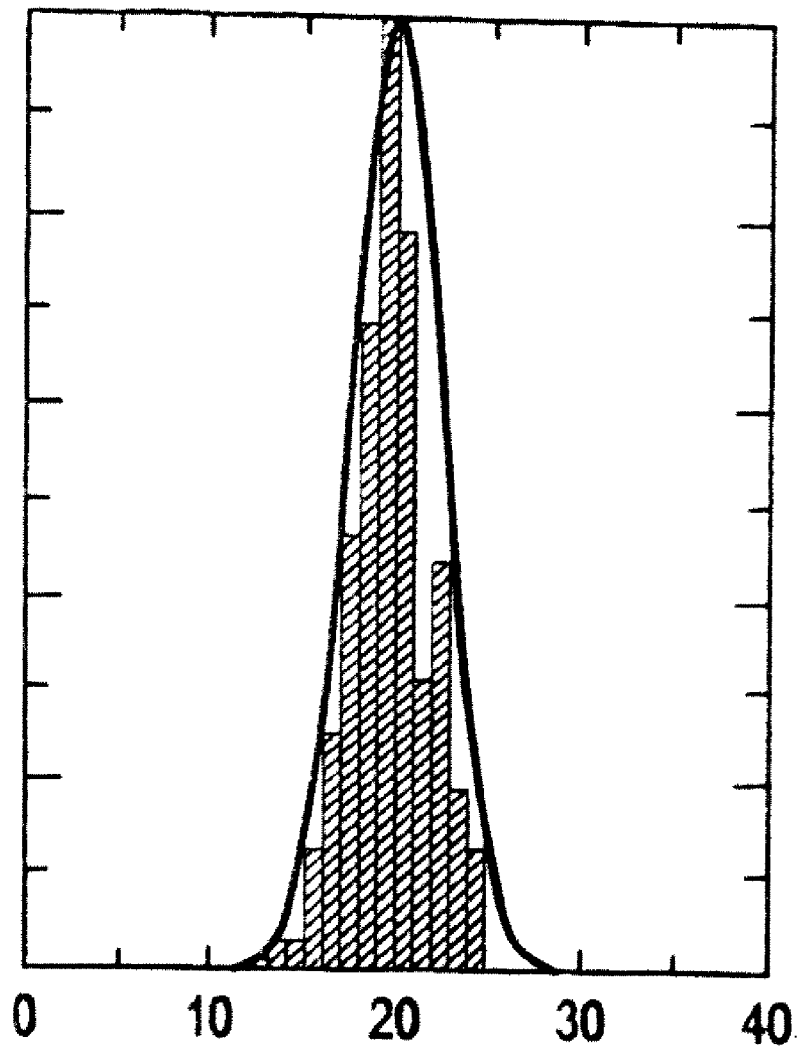

Hereinbelow and referring first to FIGS. 2(a) and 2(b), is detailed an exemplary self-assembly process using diblock copolymers exemplarily including polystyrene (PS) and poly (methyl methacrylate) (PMMA).

First, the PS-PMMA diblock copolymers are preferably diluted in a solvent such as toluene or the like, and spin-cast as a thin film preferably having a thickness within a range of about a few nanometers to about a few hundred nanometers onto a sample (e.g., such as a hard mask oxide underneath (e.g., SiO2 which is thermally grown on silicon) or the like).

Then, the sample is heated (e.g., to a temperature within a range of 140° C. to about 200° C., for several hours), thereby to promote the microphase separation (hexagonally close packed (hcp)) array of the exemplary polymers (as shown exemplarily in FIG. 2(a)), which results in an ordered array formation in the film.

It is noted that it is the temperature which allows the two types of polymers to separate themselves from one another, and gives them mobility. Thus, the temperature and the time are significant, but may vary depending upon the polymer system, with a particular thickness, concentration, etc.

For PS-PMMA copolymers having, for example, a molecular weight 67 kg/mol and a mass ratio of 70:30 PS:PMMA, the resulting self assembled film (~40 nm thick) is composed of 20-nm-diameter PMMA cylinders (e.g., the black circles shown in FIG. 2(a)) arranged in a hexagonal lattice (40 nm center-to-center spacing) embedded in a matrix of PS (e.g., shown in the white areas in FIG. 2(a) around the PMMA). Again, the temperature allows this material to phase-separate into the shown ordered pattern. Prior to being heated, the film is a mixture of the two polymers which are not physically separated yet.

Again, it is noted that other morphologies can be employed, and thus "ordered array" for purposes of the present invention is certainly not limited to hcp, and may include others such as spherical or lamellar arrays which result in a different packing arrangement and which depend on the morphology of the materials and the ratio of molecular weights of the two polymers.

Then, a simple aqueous developing step (e.g., using acetic acid or the like) can selectively remove the PMMA, leaving a porous PS film (e.g., porous template having a thickness of 40 nm center-to-center spacing of adjacent holes), as shown in FIG. 2(a).

The size and density of the holes created in the PS will be varied depending upon the molecular weights of the materials (e.g., polymers) selected. Thus, choosing a material (e.g., PMMA) with a larger molecular weight will create larger holes (e.g., larger spacings). Greater (or lesser) spacing may be desirable depending upon the application. For example, for a flash memory device, it may be desirable to scale the devices to a smaller physical size, and thereby scaling the size of the nanoparticles at the same time would be desirable. Selectively using the molecular weight of the materials allows such a scaling and control to a smaller size.

It is noted that, instead of the aqueous developing step, another step could be performed such as etching to leave the topography. Thus, the invention is not limited to the aqueous developing step.

Returning to FIG. 2(a), the black circles indicate where the PMMA resides after it is phase-separated, and the white surrounding the PMMA represents the PS matrix.

FIG. 2(b) shows a histogram of pore diameters in the PS-PMMA film. The narrow distribution (e.g., 10%) around the 20-nm mean-diameter shows that these films are highly uniform.

The characteristic dimensions of features in the self-assembled film can be adjusted by beginning with a different copolymer molecular weight, with typical pore diameters ranging from about 10 to about 100 nm.

Hence, FIG. 2(a) shows a top-down SEM image of a porous PS thin film on silicon formed by diblock copolymer self assembly. The hexagonally-arranged dark circles are cylindrical holes in the PS film down to the substrate from which the PMMA has been selectively removed. FIG. 2(b) shows a histogram of pore diameters showing a narrow distribution of ~10% centered around 20 nm for PS-PMMA molecular weight 67 kg/mol.

The thin porous polymer template formed from diblock copolymer self assembly is compatible with standard semiconductor processes (e.g., it does not introduce contamination and can be used in a manner similar to a polymer resist for reactive ion etch (RIE) transfer, etc.), and can therefore be used as a mask for transfer of the nanometer-scale pattern into an underlying film or substrate (as described below). (This is often desirable since the polymer template is neither thermally stable nor mechanically robust.)

The above steps will be used in building an exemplary device of interest according to the present invention, and as described below.

Exemplary Method of the Present Invention

Figure 3H:
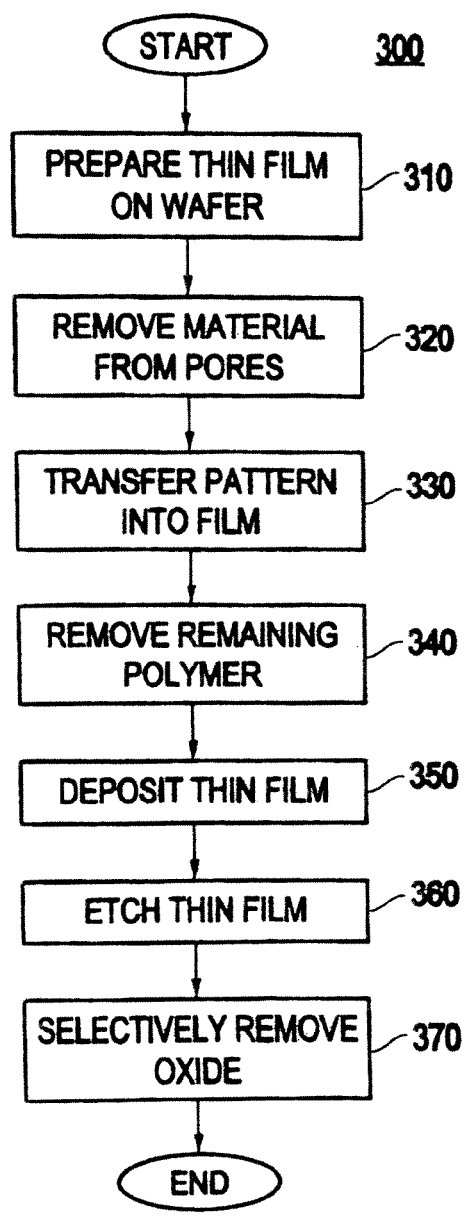
FIGS. 3(*a*)-3(*h*) illustrate schematic diagrams depicting silicon nanocrystal array formation based on diblock copolymer self assembly, and more specifically.

FIGS. 3(a)-3(g) illustrate schematic diagrams depicting a method 300 (see FIG. 3(h) showing a flowchart of the process) of silicon nanocrystal array formation based on diblock copolymer self assembly. That is, FIGS. 233(a)-3(g) illustrate schematically how to form a dense array of nanocrystals beginning with a self-assembled PS-PMMA film (e.g., which has been exemplarily formed as described above and shown in FIG. 2(a)).

First, the thin film of PS 303 and PMMA 304 is prepared on a thermally oxidized (e.g., SiO2 or the like 302) silicon wafer 301, as shown in FIG. 3(a) (step 310 in FIG. 3(h)).

Then, the PMMA 304 is removed from the pores (e.g., as shown in FIG. 3(b) and in step 320), and the pattern (e.g., PS 303) is transferred into the oxide film using a reactive ion etch (RIE) process (e.g., a directional etch using CHF3 and argon or the like as shown in FIG. 3(c) and in step 330).

Then, the remaining polymer (PS) 303 is removed (e.g., as shown in FIG. 3(d) and step 340), to leave a porous oxide film 302 which has the same dimensions as were in the porous polymer film.

In step 350 and as shown in FIG. 3(e), a thin film 306 of conformally-deposited material (e.g., silicon, such as polysilicon or amorphous silicon, or potentially other materials from which nanocrystals may be formed such as germanium or silicon germanium or metal; an amorphous silicon layer will be assumed in the exemplary process) is deposited on top of the porous oxide 302. The conformally deposited film 306 preferably should be continuous and preferably should fully conformally cover the surface. Preferably, the thin film 306 has a thickness which is more than about half the pore diameter because the holes must be filled up.

That is, since the thin film 306 should be a truly conformal deposition which covers every surface with the same thickness regardless of the surface being a vertical surface or a horizontal surface, in order to fill up or "pinch off" the holes, the thickness deposited should be at least half of the width on either side of the hole in order to pinch together. Thus, the thickness deposited should be at least half of the diameter of the pore.

Hence, since a directional etch is to be performed subsequently, it is noted that because of the dimension of the patterns, a vertical thickness of the deposited silicon layer (e.g., amorphous silicon layer) is much greater inside the hole than it is on top of the oxide. The invention takes advantage of such a greater thickness to leave material in these holes which will become the silicon nanocrystals.

Then, in step 360 and as shown in FIG. 3(f), the conformally deposited silicon 306 is etched using an anisotropic directional etch RIE process that leaves silicon 306 in the pores. Thus, the directional etch of silicon is performed (e.g., preferably selective against the silicon oxide, but not an etch stop in the conventional sense), stopping on the silicon oxide. However, as mentioned above, it is not a natural stop, and it could be possible to continue to etch and remove all of the silicon in the pores. However, this would not be desirable.

Thus, care must be taken to etch just a sufficient enough material, such that the silicon remains as discrete particles. Thus, the invention ensures that the amount of material left in the holes preserves the dimensions of the original polymer film (e.g., no shrinkage or growing thereof).

As shown in step 370 and in FIG. 3(g), optionally, the oxide 302 is selectively removed using a wet chemical etch or the like such as dilute hydrofluoric acid (HF), thereby resulting in a dense regular array of silicon "dots" (e.g., structures) extending over the sample that reproduce the pore pattern in the original PS-PMMA film.

Thus, with the exemplary process above, the invention can form an array of silicon particles having the same dimensions as the polymer pores.

It is noted that, as further described below with regard to FIGS. 4(a)-4(g), the oxide 302 may be left in building a nanocrystal memory device using the present invention.

Several related and similar techniques could be implemented to create nanocrystal arrays, such as variations on the etch processes or dielectric films used. For example, the dielectric films do not necessarily need to be SiO2. Such dielectric films could be oxide, nitride, high-k, or dielectric film stacks. Also, nanocrystals of different material, such as germanium, silicon germanium, and metal, can be created by conformal deposition of materials other than silicon, such as germanium, silicon germanium, and/or metal (e.g., different from that of silicon shown in FIG. 3(e)).

Thus, with the exemplary process of the present invention, nanoparticles (e.g., formed of silicon or the like) have been formed having uniform dimensions by self-assembly.

Exemplary Process Flow for Nanocrystal Flash Memory Fabrication

Hereinbelow, a process flow is described for fabricating the nanocrystal flash memory device, as depicted in FIGS. 4(a)-4(i) and the flowchart of FIG. 4(j), utilizing the nanoparticles having the uniform dimensions as described above.

A key advantage of this device structure is that self-assembly is used to define a dense array of uniform nanometer-scale silicon nanocrystals in the gate stack of the FET.

Gate Stack Formation

A key component of the device is a gate stack, and hereinbelow is provided a process flow for producing a stack containing uniformly-sized silicon nanocrystals separated from the silicon channel below by a thin program dielectric.

In step 410, a substrate 401 is provided (e.g., a p-type Si substrate).

Figure 4A:
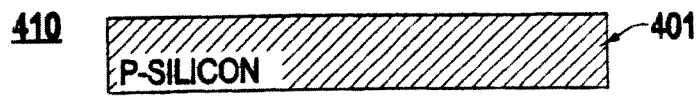
FIGS. 4(*a*)-4(*j*) illustrate a schematic process flow 400 showing formation of a nanocrystal memory device, and more specifically.
FIG. 4(e) illustrates a step of conformally depositing a material (e.g., silicon)
FIG. 4(f) illustrates a step of anisotropically etching the silicon.
FIG. 4(j) illustrates a flowchart of the method 400 shown in FIGS. 4(a)-4(i).
Figure 4B:

Then, a layer of oxide 402 (e.g., exemplarily SiO2 is used, but of course other oxides and nitrides or stack dielectrics or high k dielectrics could be employed is thermally grown on the substrate 401 or deposited by CVD or atomic layer deposition (ALD) or other means, as shown in step 420 and FIG. 4(b). This layer thickness defines nanocrystal heights, and may exemplarily be between about 2 to about 20 nm thick. As would be evident to one of ordinary skill in the art, the conductivity of the substrate could be different and the invention does not require a p-type substrate.

Figure 4C:
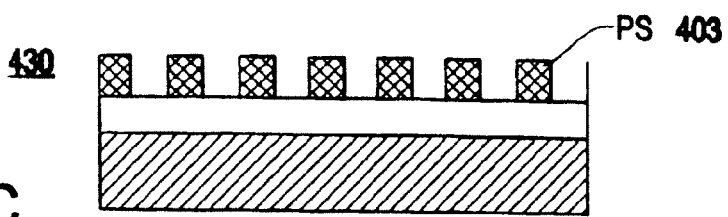

As shown in step 430 and in FIG. 4(c), the diblock copolymer 403 self assembly process is performed on top of this oxide layer 402, and the nanometer-scale pattern is transferred into oxide 402 using the RIE process depicted earlier in FIG. 3(c).

Figure 4D:
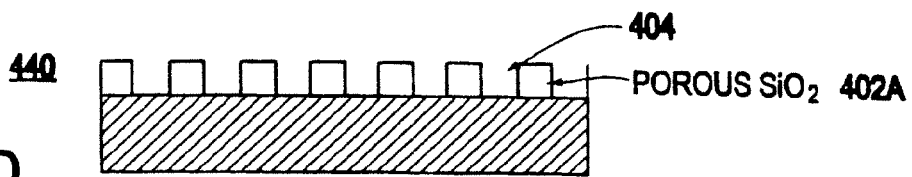

After the RIE, the polymer 403 is stripped, and the wafer cleaned (e.g., by O2 plasma, and wet chemical cleaner, or the like), thereby leaving a porous dielectric (oxide) film 402A on silicon 401, as shown in step 440 and FIG. 4(d).

At this stage, the nanometer-scale holes 404 can be optionally shrunk (e.g., to any desired size after the holes are formed) using a nitride deposition and anisotropic etch.

That is, as described above, one can start initially with different polymer molecular weights to set (e.g., template or define) any of the size, the distribution and spacing of the holes of the polymer.

However, as another option, a fixed polymer could be used, and after the polymer pattern has been transferred into oxide, the holes could be widened or shrunk once they are in the dielectric material. There are two exemplary methods for performing such a widening or shrinking of the holes.

First, in FIG. 4(d) in which the PS has been transferred into the oxide to make them porous, the holes could be further etched (e.g., overetched), which would widen the holes further laterally, but preserve their center positions, center-to-center spacing, and uniformity. This would make the holes larger. Alternatively, the holes could be shrunk by depositing a conformal, very thin (e.g., having a size of ~2-8 nm) nitride dielectric 28 deposition, and then performing an anisotropic silicon nitride RIE etch, which leaves a small nitride ring around the edge of the hole, thereby making the hole narrower than before, but preserving the uniformity of the size.

Thus, the size of the nanoparticles (to be built) can be suitably adjusted by this step, and allows setting and precisely controlling the dimensions of the nanoparticles.

Hence, in contrast to the conventional techniques including CVD processes of making a nanocrystal gate device, in which all that can be set is an exemplary particle dimension "which may be within a range of 2-50 nm" and which are scattered randomly all over the wafer with an average distance of "X", the invention can achieve a very precise controlling of the dimensions of every particle, and can set a very precise specification (e.g., a specification can be made for "a particle having a 20 nm±1-2 nm, and positioned such that each particles is spaced 40 nm from the next").

Hence, a precise spacing and sizing can be obtained by the invention. Indeed, the invention has been shown to achieve a substantially uniform particle spacing (e.g., a center-to-center spacing between adjacent particles) of no more than 20%. More specifically, the invention has been shown to achieve a substantially uniform particle spacing, having a variance of the spacing within a range of about 10 to 20%. This is in contrast to the CVD method in which the particles are typically clustered randomly on the wafer.

Figure 4E:
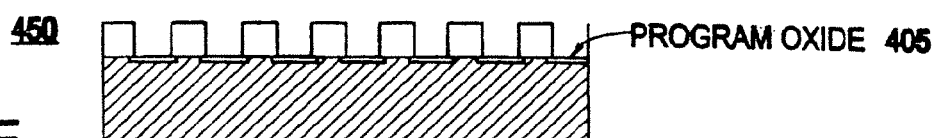

Next, as shown in step 450 and in FIG. 4(e), a program oxide 405 is thermally grown (e.g., having an exemplary thickness within a range of about 1.5 to about 4 nm).

Figure 4F:
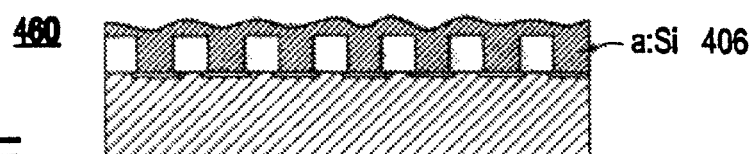

This is followed by step 460 in which a conformal silicon 406 (e.g., similar to the amorphous or polysilicon, etc. as above in step 350 of FIG. 3(e)) is deposited, as shown in FIG. 4(f).

Figure 4G:
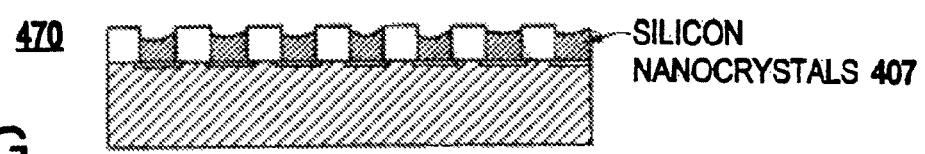

As shown in step 470 and in FIG. 4(g), nanocrystals 407 are defined and isolated from each other with an anisotropic silicon RIE which stops when the oxide layer below is reached.

The thermal oxide between the nanocrystals can be optionally thinned or removed at this stage by selective wet chemical or RIE etching.

Figure 4H:
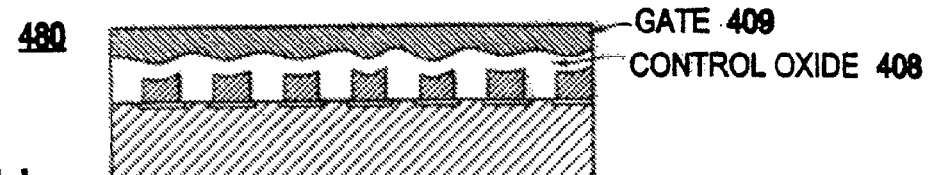
Figure 4I:
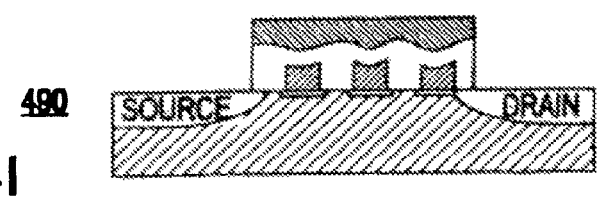
Figure 4J:
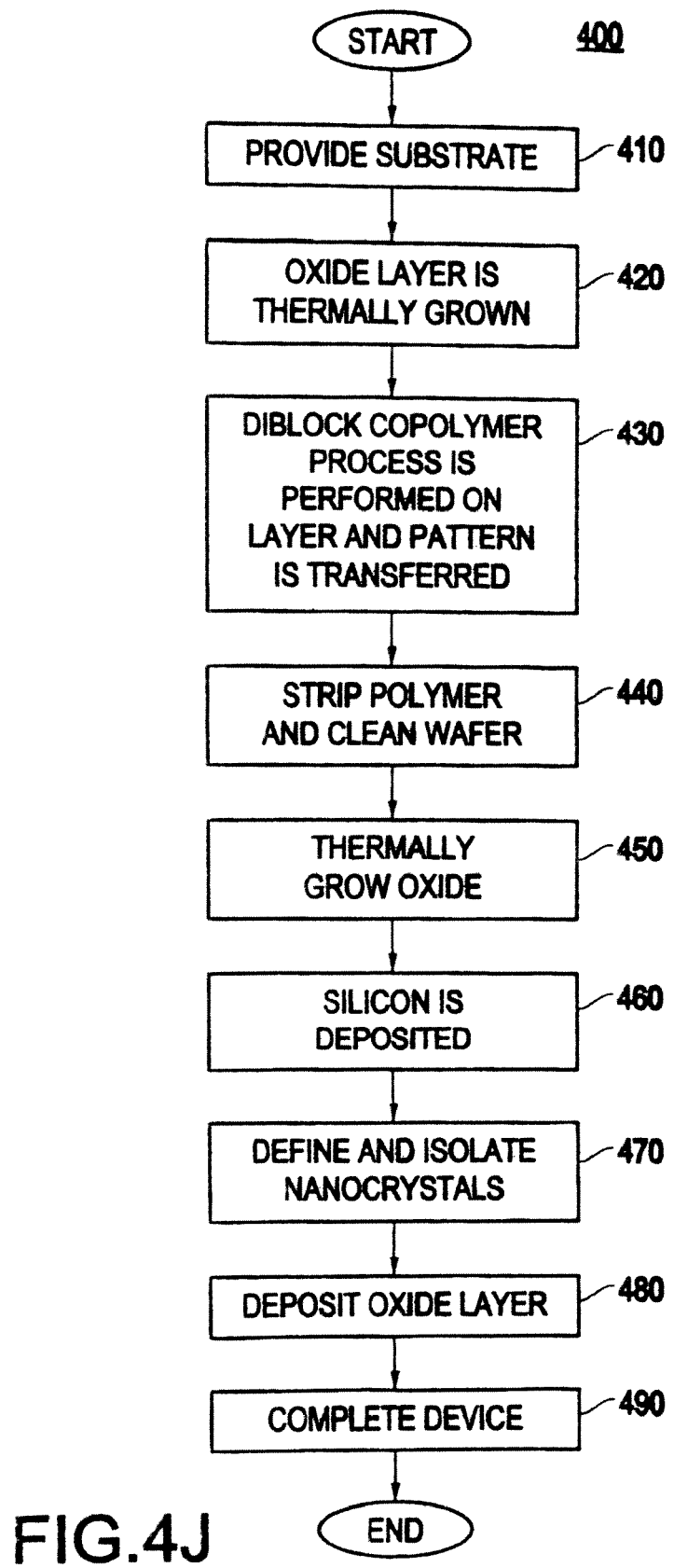

Next, in step 480 and as shown in FIG. 4(h), a layer of oxide 408 is deposited over (e.g., on top of) the nanocrystals. This layer 408 will serve as the control oxide in the device (e.g., typical thickness values range from about 4 to about 10 nm).

The control oxide is formed preferably by deposited low-temperature oxide such as low pressure CVD (LPCVD) oxide (or plasma-enchanced CVD (PECVD) or rapid thermal CVD (RTCVD) or atomic layer deposition (ALD)). Alternatively, the control oxide may be formed by thermal oxidation (e.g., preferably at a temperature within a range of about 700° to about 1100°) of the silicon nanocrystals. The gate material 409 is deposited next, and is preferably formed of poly-Si or metal having a suitable thickness.

The nanocrystals can optionally be crystallized using a high-temperature anneal. It is noted that typically, the invention may use an amorphous silicon layer which is deposited and then etched. Hence, typically the material is amorphous and not necessarily crystalline. However, the conventional device fabrication methods oftentimes use temperatures which 30 are high enough such that the particles become crystallized. Thus, with the invention, if the temperature was kept relatively low (the temperature range depending, of course, on the material being used), then the amorphous nature of the material could be retained.

It is noted again that, while the exemplary embodiment above, has used silicon to generate the nanocrystals, the invention is not so limited. Indeed, any material could be used so long as the material can be directionally etched and can be conformally deposited. For example, instead of silicon, Ge, SiGe, or another material could be employed for the nanocrystals.

Device Patterning

Once the gate stack is grown, the device can be completed (source/drain patterning, gate contact) using standard FET fabrication processes.

Such processes may involve removing the nanocrystals from the source/drain region, patterning the source/drain, and performing a self-aligned source/drain implant to define highly-doped regions. These processes are schematically illustrated in step 490 and in FIG. 4(i).

Thus, with the unique and unobvious combination of exemplary features of the invention, a nanocrystal memory device can be formed in which the nanocrystals can be defined using a self-assembly process.

Further, the nanocrystal memory device (and method for forming it) allows good control over the uniformity of the size of the nanocrystal particles, and over their distribution (e.g., where the nanocrystals are located 31 and the spacing between them). Thus, the inventive method results in a device having a regular array of such nanocrystals throughout the active area of the device.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A method of making a uniform nanoparticle array, comprising:
    performing diblock copolymer thin film self assembly over a first dielectric on silicon;
    creating a porous polymer film;
    transferring a pattern into said first dielectric;
    selectively growing epitaxial silicon off a silicon substrate from within pores to create a silicon nanoparticle array; and
    shrinking nanoparticles in said nanoparticle array by oxidation or etching.

2. A method of making a uniform nanoparticle array, comprising:
    performing diblock copolymer thin film self assembly over a first dielectric on silicon;
    creating a porous polymer film;
    transferring a pattern into said first dielectric;
    selectively growing epitaxial silicon off a silicon substrate from within pores to create a silicon nanoparticle array; and
    one of shrinking pores with a spacer process prior to forming said nanoparticle array, and enlarging pores by etching prior to said forming said nanoparticle array.

3. A method for fabricating nanocrystal memory device, comprising:
    a method of making a uniform nanoparticle array, comprising:
        performing diblock copolymer thin film self assembly over a first dielectric on silicon;
        creating a porous polymer film;
        transferring a pattern into said first dielectric; and
        selectively growing epitaxial silicon off a silicon substrate from within pores to create a silicon nanoparticle array;
    forming an oxide layer over nanoparticles of the nanoparticle array; and
    depositing a gate material over said oxide layer.

4. The method of claim 3, wherein said oxide layer serves as a control oxide in the device, and includes a thickness within a range from about 4 to about 10 nm.

5. The method of claim 3, further comprising:
    thermally growing a program oxide prior to forming an amorphous silicon layer for use in forming said nanoparticles.

* * * * *